United States Patent
Ritenour

(10) Patent No.: US 9,129,802 B2
(45) Date of Patent: Sep. 8, 2015

(54) LATERAL SEMICONDUCTOR DEVICE WITH VERTICAL BREAKDOWN REGION

(71) Applicant: RF Micro Devices, Inc., Greensboro, NC (US)

(72) Inventor: Andrew P. Ritenour, Colfax, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 13/973,482

(22) Filed: Aug. 22, 2013

(65) Prior Publication Data
US 2014/0054585 A1 Feb. 27, 2014

Related U.S. Application Data

(60) Provisional application No. 61/693,487, filed on Aug. 27, 2012.

(51) Int. Cl.
*H01L 21/00* (2006.01)
*H01L 27/02* (2006.01)
(Continued)

(52) U.S. Cl.
CPC ........ *H01L 27/0248* (2013.01); *H01L 29/4175* (2013.01); *H01L 29/41775* (2013.01); *H01L 29/2003* (2013.01); *H01L 29/778* (2013.01); *H01L 29/861* (2013.01)

(58) Field of Classification Search
CPC ............... H01L 27/0248; H01L 29/41775; H01L 29/4175; H01L 29/778; H01L 29/861; H01L 29/2003
USPC ................... 257/43, 278, 76, 192, 77
See application file for complete search history.

(56) References Cited

U.S. PATENT DOCUMENTS

| 4,317,055 A | 2/1982 | Yoshida et al. |
| 4,540,954 A | 9/1985 | Apel |

(Continued)

FOREIGN PATENT DOCUMENTS

| EP | 1187229 A1 | 3/2002 |
| EP | 1826041 A1 | 8/2007 |

(Continued)

OTHER PUBLICATIONS

International Search Report and Written Opinion for PCT/US2013/056105, mailed Feb. 12, 2014, 15 pages.

(Continued)

*Primary Examiner* — Laura Menz
(74) *Attorney, Agent, or Firm* — Withrow & Terranova, P.L.L.C.

(57) ABSTRACT

A lateral semiconductor device having a vertical region for providing a protective avalanche breakdown (PAB) is disclosed. The lateral semiconductor device has a lateral structure that includes a conductive substrate, semi-insulating layer(s) disposed on the conductive substrate, device layer(s) disposed on the semi-insulating layer(s), along with a source electrode and a drain electrode disposed on the device layer(s). The vertical region is separated from the source electrode by a lateral region wherein the vertical region has a relatively lower breakdown voltage level than a relatively higher breakdown voltage level of the lateral region for providing the PAB within the vertical region to prevent a potentially damaging breakdown of the lateral region. The vertical region is structured to be more rugged than the lateral region and thus will not be damaged by a PAB event.

18 Claims, 2 Drawing Sheets

(51) Int. Cl.
*H01L 29/417* (2006.01)
*H01L 29/778* (2006.01)
*H01L 29/861* (2006.01)
*H01L 29/20* (2006.01)

(56) References Cited

U.S. PATENT DOCUMENTS

| | | | |
|---|---|---|---|
| 4,543,535 A | 9/1985 | Ayasli | |
| 4,620,207 A | 10/1986 | Calviello | |
| 4,788,511 A | 11/1988 | Schindler | |
| 5,028,879 A | 7/1991 | Kim | |
| 5,046,155 A | 9/1991 | Beyer et al. | |
| 5,047,355 A | 9/1991 | Huber et al. | |
| 5,107,323 A | 4/1992 | Knolle et al. | |
| 5,118,993 A | 6/1992 | Yang | |
| 5,208,547 A | 5/1993 | Schindler | |
| 5,227,734 A | 7/1993 | Schindler et al. | |
| 5,306,656 A | 4/1994 | Williams et al. | |
| 5,361,038 A | 11/1994 | Allen et al. | |
| 5,365,197 A | 11/1994 | Ikalainen | |
| 5,389,571 A | 2/1995 | Takeuchi et al. | |
| 5,414,387 A | 5/1995 | Nakahara et al. | |
| 5,485,118 A | 1/1996 | Chick | |
| 5,608,353 A | 3/1997 | Pratt | |
| 5,629,648 A | 5/1997 | Pratt | |
| 5,698,870 A | 12/1997 | Nakano et al. | |
| 5,742,205 A | 4/1998 | Cowen et al. | |
| 5,764,673 A | 6/1998 | Kawazu et al. | |
| 5,834,326 A | 11/1998 | Miyachi et al. | |
| 5,843,590 A | 12/1998 | Miura et al. | |
| 5,864,156 A | 1/1999 | Juengling | |
| 5,874,747 A | 2/1999 | Redwing et al. | |
| 5,880,640 A | 3/1999 | Dueme | |
| 5,914,501 A | 6/1999 | Antle et al. | |
| 5,949,140 A | 9/1999 | Nishi et al. | |
| 6,049,250 A | 4/2000 | Kintis et al. | |
| 6,064,082 A | 5/2000 | Kawai et al. | |
| 6,110,757 A | 8/2000 | Udagawa et al. | |
| 6,130,579 A | 10/2000 | Iyer et al. | |
| 6,133,589 A | 10/2000 | Krames et al. | |
| 6,177,685 B1 | 1/2001 | Teraguchi et al. | |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,306,709 B1 | 10/2001 | Miyagi et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,342,815 B1 | 1/2002 | Kobayashi | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,373,318 B1 | 4/2002 | Dohnke et al. | |
| 6,376,864 B1 | 4/2002 | Wang | |
| 6,377,125 B1 | 4/2002 | Pavio et al. | |
| 6,384,433 B1 | 5/2002 | Barratt et al. | |
| 6,387,733 B1 | 5/2002 | Holyoak et al. | |
| 6,392,487 B1 | 5/2002 | Alexanian | |
| 6,400,226 B2 | 6/2002 | Sato | |
| 6,404,287 B2 | 6/2002 | Dening et al. | |
| 6,448,793 B1 | 9/2002 | Barratt et al. | |
| 6,455,877 B1 | 9/2002 | Ogawa et al. | |
| 6,475,916 B1 | 11/2002 | Lee et al. | |
| 6,477,682 B2 | 11/2002 | Cypher | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,589,877 B1 | 7/2003 | Thakur | |
| 6,593,597 B2 | 7/2003 | Sheu | |
| 6,608,367 B1 | 8/2003 | Gibson et al. | |
| 6,614,281 B1 | 9/2003 | Baudelot et al. | |
| 6,621,140 B1 | 9/2003 | Gibson et al. | |
| 6,624,452 B2 | 9/2003 | Yu et al. | |
| 6,627,552 B1 | 9/2003 | Nishio et al. | |
| 6,633,073 B2 | 10/2003 | Rezvani et al. | |
| 6,633,195 B2 | 10/2003 | Baudelot et al. | |
| 6,639,470 B1 | 10/2003 | Andrys et al. | |
| 6,656,271 B2 | 12/2003 | Yonehara et al. | |
| 6,657,592 B2 | 12/2003 | Dening et al. | |
| 6,660,606 B2 | 12/2003 | Miyabayashi et al. | |
| 6,701,134 B1 | 3/2004 | Epperson | |
| 6,701,138 B2 | 3/2004 | Epperson et al. | |
| 6,706,576 B1 | 3/2004 | Ngo et al. | |
| 6,720,831 B2 | 4/2004 | Dening et al. | |
| 6,723,587 B2 | 4/2004 | Cho et al. | |
| 6,724,252 B2 | 4/2004 | Ngo et al. | |
| 6,727,762 B1 | 4/2004 | Kobayashi | |
| 6,748,204 B1 | 6/2004 | Razavi et al. | |
| 6,750,158 B2 | 6/2004 | Ogawa et al. | |
| 6,750,482 B2 | 6/2004 | Seaford et al. | |
| 6,759,907 B2 | 7/2004 | Orr et al. | |
| 6,802,902 B2 | 10/2004 | Beaumont et al. | |
| 6,815,722 B2 | 11/2004 | Lai et al. | |
| 6,815,730 B2 | 11/2004 | Yamada | |
| 6,822,842 B2 | 11/2004 | Friedrichs et al. | |
| 6,861,677 B2 | 3/2005 | Chen | |
| 6,943,631 B2 | 9/2005 | Scherrer et al. | |
| 7,015,512 B2 | 3/2006 | Park et al. | |
| 7,026,665 B1 | 4/2006 | Smart et al. | |
| 7,033,961 B1 | 4/2006 | Smart et al. | |
| 7,042,150 B2 | 5/2006 | Yasuda | |
| 7,052,942 B1 | 5/2006 | Smart et al. | |
| 7,211,822 B2 | 5/2007 | Nagahama et al. | |
| 7,408,182 B1 | 8/2008 | Smart et al. | |
| 7,449,762 B1* | 11/2008 | Singh | 257/493 |
| 7,459,356 B1 | 12/2008 | Smart et al. | |
| 7,557,421 B1 | 7/2009 | Shealy et al. | |
| 7,719,055 B1 | 5/2010 | McNutt et al. | |
| 7,768,758 B2 | 8/2010 | Maier et al. | |
| 7,804,262 B2 | 9/2010 | Schuster et al. | |
| 7,935,983 B2* | 5/2011 | Saito et al. | 257/183 |
| 7,968,391 B1 | 6/2011 | Smart et al. | |
| 7,974,322 B2 | 7/2011 | Ueda et al. | |
| 8,017,981 B2 | 9/2011 | Sankin et al. | |
| 8,405,068 B2 | 3/2013 | O'Keefe | |
| 8,502,258 B2 | 8/2013 | O'Keefe | |
| 8,633,518 B2 | 1/2014 | Suh et al. | |
| 8,692,294 B2 | 4/2014 | Chu et al. | |
| 8,785,976 B2 | 7/2014 | Nakajima et al. | |
| 2001/0040246 A1* | 11/2001 | Ishii | 257/192 |
| 2001/0054848 A1 | 12/2001 | Baudelot et al. | |
| 2002/0031851 A1 | 3/2002 | Linthicum et al. | |
| 2002/0048302 A1 | 4/2002 | Kimura | |
| 2002/0079508 A1 | 6/2002 | Yoshida | |
| 2003/0003630 A1 | 1/2003 | Iimura et al. | |
| 2003/0122139 A1 | 7/2003 | Meng et al. | |
| 2003/0160307 A1 | 8/2003 | Gibson et al. | |
| 2003/0160317 A1 | 8/2003 | Sakamoto et al. | |
| 2003/0206440 A1 | 11/2003 | Wong | |
| 2003/0209730 A1 | 11/2003 | Gibson et al. | |
| 2003/0218183 A1 | 11/2003 | Micovic et al. | |
| 2004/0070003 A1 | 4/2004 | Gaska et al. | |
| 2004/0130037 A1 | 7/2004 | Mishra et al. | |
| 2004/0241916 A1 | 12/2004 | Chau et al. | |
| 2005/0139868 A1 | 6/2005 | Anda | |
| 2005/0189559 A1 | 9/2005 | Saito et al. | |
| 2005/0189562 A1 | 9/2005 | Kinzer et al. | |
| 2005/0194612 A1 | 9/2005 | Beach | |
| 2005/0212049 A1 | 9/2005 | Onodera | |
| 2005/0225912 A1 | 10/2005 | Pant et al. | |
| 2005/0271107 A1 | 12/2005 | Murakami et al. | |
| 2006/0043385 A1 | 3/2006 | Wang et al. | |
| 2006/0068601 A1 | 3/2006 | Lee et al. | |
| 2006/0124960 A1 | 6/2006 | Hirose et al. | |
| 2006/0243988 A1 | 11/2006 | Narukawa et al. | |
| 2007/0093009 A1 | 4/2007 | Baptist et al. | |
| 2007/0295985 A1 | 12/2007 | Weeks, Jr. et al. | |
| 2008/0023706 A1* | 1/2008 | Saito et al. | 257/76 |
| 2008/0073752 A1 | 3/2008 | Asai et al. | |

(56) References Cited

U.S. PATENT DOCUMENTS

| | | | |
|---|---|---|---|
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0278137 A1* | 11/2009 | Sheridan et al. ............. 257/77 |
| 2010/0025657 A1 | 2/2010 | Nagahama et al. |
| 2010/0133567 A1 | 6/2010 | Son |
| 2010/0187575 A1 | 7/2010 | Baumgartner et al. |
| 2010/0207164 A1* | 8/2010 | Shibata et al. ............. 257/192 |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0095337 A1 | 4/2011 | Sato |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0211802 A1 | 8/2012 | Tamari |
| 2012/0218783 A1* | 8/2012 | Imada ............. 363/17 |
| 2012/0262220 A1 | 10/2012 | Springett |
| 2013/0277687 A1 | 10/2013 | Kobayashi et al. |
| 2013/0280877 A1 | 10/2013 | Kobayashi et al. |
| 2014/0054585 A1* | 2/2014 | Ritenour ............. 257/43 |

FOREIGN PATENT DOCUMENTS

| | | | |
|---|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |
| WO | WO 2014035794 A1 * | 3/2014 |

OTHER PUBLICATIONS

Chang, S.J. et al, "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p—GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN—GaN light-emitting diodes," Applied Physics Letters, vol. 89, Jul. 11, 2009, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

Notice of Allowance for U.S. Appl. No. 11/458,833, mailed Mar. 9, 2009, 7 pages.

(56) References Cited

OTHER PUBLICATIONS

Invitation to Pay Fees for PCT/US2013/056105, mailed Nov. 5, 2013, 7 pages.
International Search Report and Written Opinion for PCT/US2013/056126, mailed Oct. 25, 2013, 10 pages.
International Search Report and Written Opinion for PCT/US2013/056132, mailed Oct. 10, 2013, 11 pages.
International Search Report and Written Opinion for PCT/US2013/056187, mailed Oct. 10, 2013, 11 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 13/927,182, mailed May 1, 2014, 7 pages.
Non-Final Office Action for U.S. Appl. No. 13/795,986, mailed Apr. 24, 2014, 13 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Boutros, K.S., et al., "5W GaN MMIC for Millimeter-Wave Applications," 2006 Compound Semiconductor Integrated Circuit Symposium, Nov. 2006, pp. 93-95.
Cho, H., et al., "High Density Plasma Via Hole Etching in SiC," Journal of Vacuum Science & Technology A: Surfaces, and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Non-Final Office Action for U.S. Appl. No. 13/795,926, mailed Dec. 19, 2014, 14 pages.
Non-Final Office Action for U.S. Appl. No. 13/942,998, mailed Nov. 19, 2014, 9 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Notice of Allowance for U.S. Appl. No. 13/914,060, mailed Nov. 13, 2014, 8 pages.
Final Office Action for U.S. Appl. No. 13/966,400, mailed Dec. 3, 2014, 8 pages.
Final Office Action for U.S. Appl. No. 13/795,986, mailed Dec. 5, 2014, 16 pages.
Author Unknown, "CGHV1J006D: 6 W, 18.0 GHz, GaN HEMT Die," Cree, Inc., 2014, 9 pages.
International Preliminary Report on Patentability for PCT/US2013/056105, mailed Mar. 5, 2015, 12 pages.
Advisory Action for U.S. Appl. No. 13/910,202, mailed Apr. 6, 2015, 3 pages.
International Preliminary Report on Patentability for PCT/US2013/056126, mailed Mar. 5, 2015, 7 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.
Final Office Action for U.S. Appl. No. 13/871,526, mailed Jun. 17, 2015, 11 pages.
Notice of Allowance for U.S. Appl. No. 13/910,202, mailed May 14, 2015, 9 pages.
Notice of Allowance for U.S. Appl. No. 13/974,488, mailed May 29, 2015, 9 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/957,698, mailed Jul. 20, 2015, 7 pages.

* cited by examiner

LATERAL SEMICONDUCTOR DEVICE WITH VERTICAL BREAKDOWN REGION

RELATED APPLICATIONS

This application claims the benefit of U.S. provisional patent application No. 61/693,487, filed Aug. 27, 2012, the disclosure of which is incorporated herein by reference in its entirety.

FIELD OF THE DISCLOSURE

The present disclosure relates to electronic devices that include overvoltage and current surge protection.

BACKGROUND

Gallium nitride (GaN) is commonly cited as a superior material for high-voltage power devices due to its wide bandgap and associated high electric field required for avalanche breakdown. Ideal bulk GaN crystals have critical fields in excess of 3,000,000 V per centimeter. However, during operation of a lateral semiconductor device such as a GaN high electron mobility transistor (HEMT) a generally two dimensional electric field is concentrated at the corners of a gate and/or field plates. As a result, high electric fields can occur in dielectrics around the gate and/or field plates. Moreover, in practice, a high electric field needed for avalanche breakdown is lowered by non-idealities that are present within the structure of a GaN device. During high-voltage operation of a GaN device, electrical breakdown will typically occur at defects and/or at locations with a concentrated electric field. An example of such a breakdown location is a corner of a Schottky gate. An ideal structure comprising a bulk crystal such as silicon carbide (SiC) or GaN will avalanche uniformly in a high electric field region. As a result, avalanche energy is distributed uniformly, which greatly enhances the survivability of a device made up of an ideal bulk crystal. For example, vertical p-n junctions fabricated in SiC homoepitaxial layers demonstrate avalanche breakdown ruggedness. However, breakdown in defective GaN layers will typically occur at defects within defective GaN layers. A resulting high energy density typically causes irreversible damage to a device that includes defective GaN layers.

Another factor impacting breakdown ruggedness is the nature of the metal semiconductor contacts that carry a breakdown current. Previous work with SiC Schottky diodes has demonstrated that Schottky contacts can be degraded by avalanche current. In response to this problem, junction barrier Schottky diodes have been developed to urge avalanche breakdown to occur across a bulk p-n junction with ohmic contacts rather than Schottky contacts. Thus, the breakdown ruggedness of GaN HEMTs may be limited by breakdown events in highly localized areas within a semiconductor due to crystal defects and/or electric field concentration. Moreover, the breakdown ruggedness of GaN HEMTs may be limited by an electrical breakdown of adjacent dielectric layers and/or high current flow through the Schottky gate electrode during breakdown events. Thus, there is a need to provide overvoltage protection for a lateral semiconductor device to ensure that the lateral semiconductor device handles a typically destructive breakdown voltage without being damaged.

SUMMARY

A lateral semiconductor device having a vertical region for providing a protective avalanche breakdown (PAB) is disclosed. The lateral semiconductor device has a lateral structure that includes a conductive substrate, semi-insulating layer(s) disposed on the conductive substrate, device layer(s) disposed on the semi-insulating layer(s), along with a source electrode and a drain electrode disposed on the device layer(s). The vertical region is separated from the source electrode by a lateral region wherein the vertical region has a relatively lower breakdown voltage level than a relatively higher breakdown voltage level of the lateral region for providing the PAB within the vertical region to prevent a potentially damaging breakdown of the lateral region. The vertical region is structured to be more rugged than the lateral region and thus will not be damaged by a PAB event. As a result, the lateral semiconductor device of the present disclosure has an advantage of surviving potentially damaging overvoltage and current surges.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure describes embodiments of a lateral semiconductor device having a vertical region for providing a protective avalanche breakdown (PAB) that enhances the voltage breakdown ruggedness of the lateral semiconductor device. The vertical region provides a relatively lower breakdown voltage than a lateral region of the lateral semiconductor device. As such, the vertical region prevents a voltage breakdown from occurring in the lateral region of the lateral semiconductor device.

Figure 1:
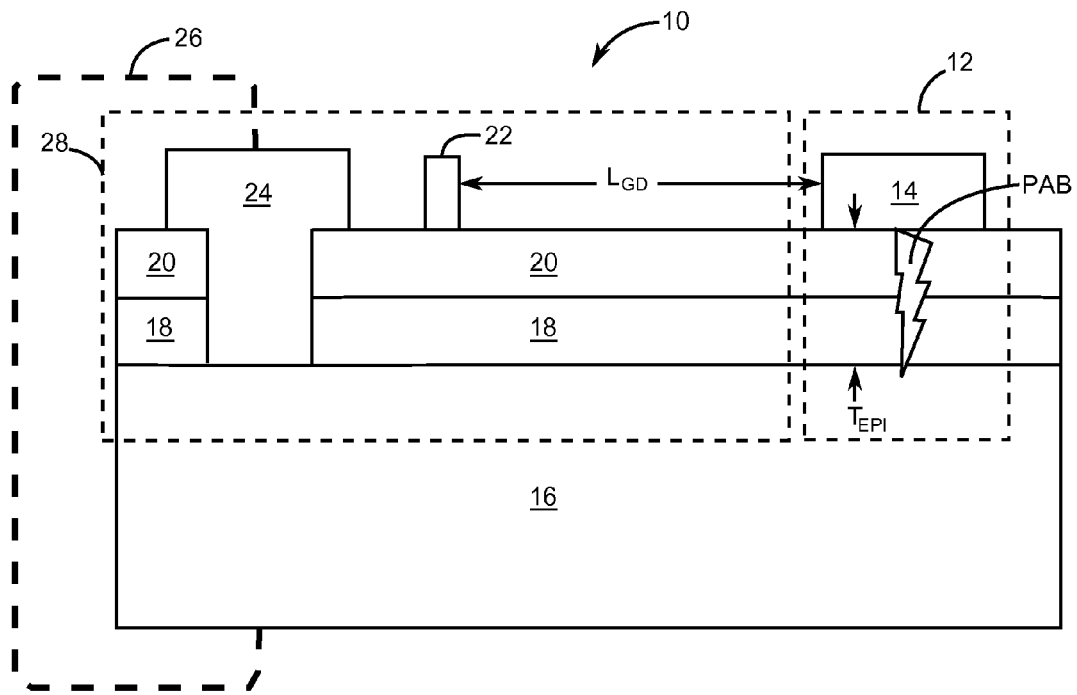
FIG. 1 is sectional view of a lateral transistor having a vertical region for protective avalanche breakdown between a drain electrode and a conductive substrate.

FIG. 1 is a first embodiment of a lateral semiconductor device in the form of lateral transistor 10 having a vertical region 12 for protective avalanche breakdown between a drain electrode 14 and a conductive substrate 16. For the purpose of this disclosure, a PAB is represented by a lightning bolt symbol. A semi-insulating layer(s) 18 and a device layer(s) 20 are disposed between the drain electrode 14 and the conductive substrate 16 with the drain electrode 14 being disposed onto the device layer(s) 20. A gate electrode 22 and a source electrode 24 are also disposed on the device layer(s) 20. However, the source electrode 24 is coupled to the conductive substrate 16 either internally or optionally by an external connection 26, which is shown using a thick dashed line in FIG. 1. The vertical region 12 has a relatively lower breakdown voltage in comparison to a relatively larger breakdown voltage of a lateral region 28. As a result, voltage breakdown is prevented from occurring within the lateral region 28.

The relatively lower breakdown voltage is achieved in this embodiment by adjusting a thickness $T_{EPI}$ of epitaxial layers making up the semi-insulating layer(s) 18 and the device layer(s) 20 inside the vertical region 12 to be relatively less than a minimum lateral distance $L_{GD}$ between the drain electrode 14 and gate electrode 22. Moreover, a lateral distance $L_{GD}$ between the drain electrode 14 and the gate electrode 22 substantially influences the breakdown voltage of the lateral region 28. Moreover, other causes that influence the breakdown voltage of the vertical region 12 and the breakdown voltage of the lateral region 28 might not be related. As such, no assumption is made that the $T_{EPI}$ should be less than the $L_{GD}$ in all circumstances. However, the $T_{EPI}$ is less that the $L_{GD}$ in typical circumstances. In any case, adjustments to the $T_{EPI}$ relative to the $L_{GD}$ must ensure that the breakdown voltage of the vertical region 12 is consistently less than the breakdown voltage of the lateral region 28. Preferably, a PAB should occur in the vertical region 12 just before a voltage breakdown of the lateral region 28. Yet, as alluded to above, a margin between the PAB and the voltage breakdown of the lateral region 28 must be maintained to ensure the PAB occurs before the voltage breakdown of the lateral region 28.

Figure 2:
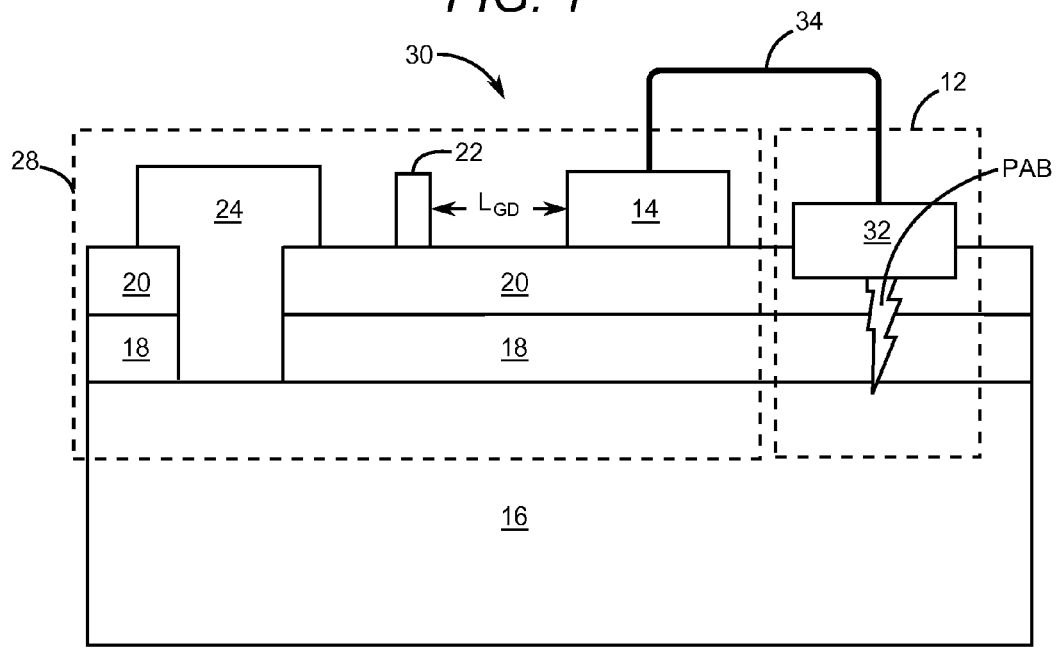
FIG. 2 is a sectional view of a lateral transistor wherein the vertical region includes an avalanche electrode coupled to the drain electrode and the conductive substrate.

FIG. 2 is a lateral transistor 30 wherein the vertical region 12 includes an avalanche electrode 32 coupled to the drain electrode 14. In this embodiment, the avalanche electrode 32 is located within the vertical region 12 and is partially embedded in the device layer(s) 20. Moreover, the drain electrode 14 is disposed on the device layer(s) 20 at a location outside of the vertical region 12 and inside the lateral region 28. The drain electrode 14 is coupled to the avalanche electrode 32 via a conductor 34.

Figure 3:
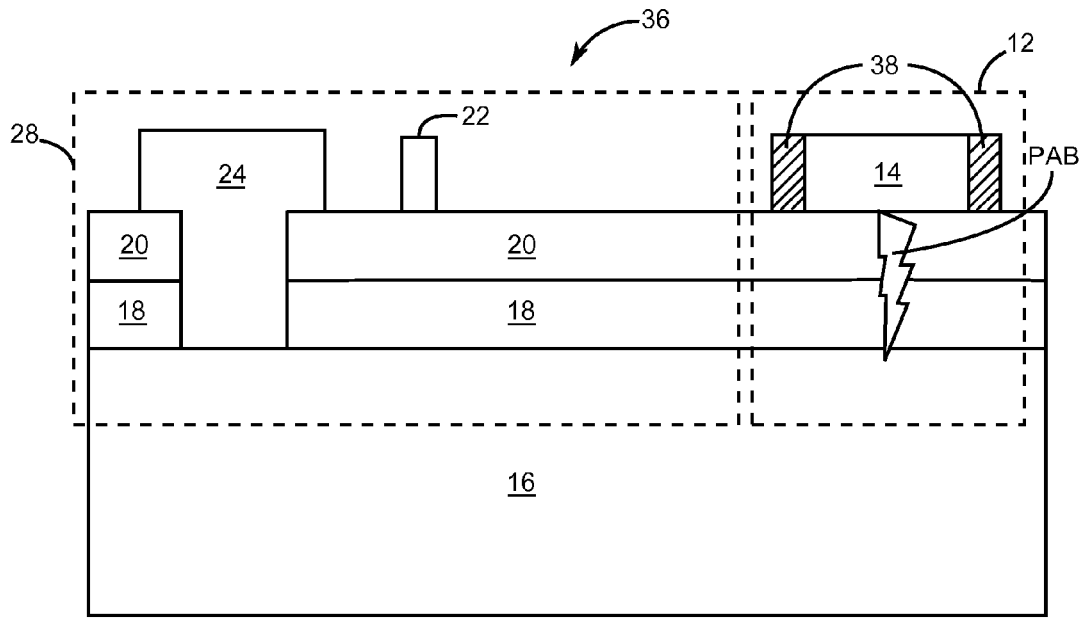
FIG. 3 is a sectional view of a lateral transistor wherein the drain electrode includes an edge termination and is located within the vertical region.

FIG. 3 is a sectional view of a lateral transistor 36 wherein the drain electrode 14 includes an edge termination 38 and is located within the vertical region 12. The edge termination 38 reduces a two-dimensional electric field about the edge of the drain electrode 14, thereby making a PAB that occurs within the vertical region 12 more uniform.

Figure 4:
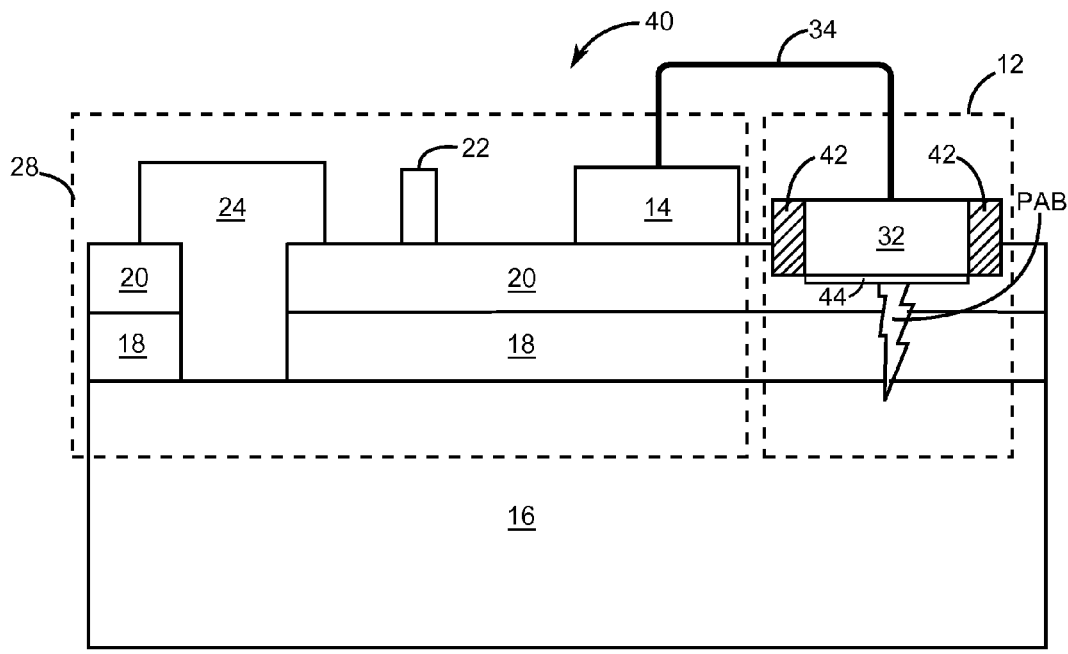
FIG. 4 is a sectional view of a lateral transistor wherein the drain electrode is coupled to the avalanche electrode that includes an edge termination.

FIG. 4 is a sectional view of a lateral transistor 40 wherein the avalanche electrode 32 includes an edge termination 42 for reducing a two-dimensional electric field that typically forms about the avalanche electrode 32. In this embodiment, the avalanche electrode 32 is located within the vertical region 12 and is partially embedded in the device layer(s) 20. Moreover, the drain electrode 14 is disposed on the device layer(s) 20 at a location outside of the vertical region 12 and inside of the lateral region 28. The drain electrode 14 is coupled to the avalanche electrode 32 via the conductor 34.

In at least one of the above embodiments, at least a portion of the vertical region 12 between the drain electrode 14 or avalanche electrode 32 and the conductive substrate 16 is doped to form a p-n junction 44 between the drain electrode 14 and the conductive substrate 16. The p-n junction 44 is a relatively rugged semiconductor structure that allows a PAB event to be non-destructive. In at least one embodiment, the p-n junction 44 comprises at least a portion of the drain electrode 14 of FIGS. 1 and 3, or the avalanche electrode 32 of FIGS. 2 and 4. Moreover, in at least one embodiment, at least a portion of the drain electrode 14 or the avalanche electrode 32 in contact with the device layer(s) 20 is an ohmic contact. In at least one other embodiment, at least a portion of the drain electrode 14 or the avalanche electrode 32 in contact with the device layer(s) 20 is a Schottky contact. The conductive substrate 16 can be, but is not limited to, silicon carbide (SiC), silicon (Si), gallium nitride (GaN), and zinc oxide (ZnO). In one embodiment, a bulk resistivity for the conductive substrate 16 ranges from around about 100 ohm-cm to around about 10 ohm-cm. In another embodiment, a bulk resistivity for the conductive substrate 16 ranges from around about 10 ohm-cm to around about 0.01 ohm-cm.

It is to be understood that the structures and techniques of the present disclosure are extendable to semiconductor devices other than transistors. For example, a lateral diode having a drain electrode that is an anode and a source electrode that is a cathode can be fabricated to include the vertical region for providing a PAB.

Those skilled in the art will recognize improvements and modifications to the embodiments of the present disclosure. All such improvements and modifications are considered within the scope of the concepts disclosed herein and the claims that follow.

What is claimed is:

1. A lateral semiconductor device comprising:
   a lateral structure comprising:
      a conductive substrate;
      at least one semi-insulating layer disposed on the conductive substrate;
      at least one device layer disposed on the at least one semi-insulating layer;
      a source electrode disposed on the at least one device layer;
      a drain electrode disposed on the at least one device layer;
      a vertical region that includes the drain electrode and at least a portion of the conductive substrate and that is separated from the source electrode by a lateral region wherein a breakdown voltage level for a protective avalanche breakdown (PAB) of the vertical region is lower than a breakdown voltage level of the lateral region; and
   an edge termination integral with the drain electrode.

2. The lateral semiconductor device of claim 1 wherein epitaxial layers making up the at least one semi-insulating layer and the at least one device layer have a thickness that is less than a minimum lateral distance between the drain electrode and a gate electrode disposed on the at least one device layer, thereby lowering the breakdown voltage level for a PAB of the vertical region relative to the breakdown voltage level of the lateral region.

3. The lateral semiconductor device of claim 1 wherein at least a portion of the vertical region between the drain electrode and the conductive substrate is doped to form a p-n junction between the drain electrode and the conductive substrate.

4. The lateral semiconductor device of claim 3 wherein the p-n junction comprises at least a portion of the drain electrode.

5. The lateral semiconductor device of claim 1 further including an avalanche electrode disposed on the at least one device layer within the vertical region and coupled to the drain electrode, wherein the drain electrode is within the lateral region.

6. The lateral semiconductor device of claim 5 further including an edge termination integral with the avalanche electrode.

7. The lateral semiconductor device of claim 5 wherein the avalanche electrode is at least partially embedded within the at least one device layer.

8. The lateral semiconductor device of claim 5 wherein at least a portion of the vertical region between the drain electrode and the conductive substrate is a p-n junction.

9. The lateral semiconductor device of claim 8 wherein the p-n junction comprises at least a portion of the avalanche electrode.

10. The lateral semiconductor device of claim 5 wherein at least a portion of the avalanche electrode is an ohmic contact.

11. The lateral semiconductor device of claim 5 wherein at least a portion of the avalanche electrode is a Schottky contact.

12. The lateral semiconductor device of claim 1 wherein at least one portion of the drain electrode is an ohmic contact.

13. The lateral semiconductor device of claim 1 wherein at least a portion of the drain electrode is a Schottky contact.

14. The lateral semiconductor device of claim 1 wherein the conductive substrate is silicon carbide (SiC).

15. The lateral semiconductor device of claim 1 wherein the conductive substrate is gallium nitride (GaN).

16. The lateral semiconductor device of claim 1 wherein the conductive substrate is zinc oxide (ZnO).

17. The lateral semiconductor device of claim 1 wherein a bulk resistivity of the conductive substrate ranges from around about 100 ohm-cm to around about 10 ohm-cm.

18. The lateral semiconductor device of claim 1 wherein a bulk resistivity of the conductive substrate ranges from around about 10 ohm-cm to around about 0.01 ohm-cm.

* * * * *